(12) United States Patent
Moriya

(10) Patent No.: US 7,326,940 B2
(45) Date of Patent: Feb. 5, 2008

(54) EXPOSURE APPARATUS, EXPOSURE METHOD AND SEMICONDUCTOR DEVICE PRODUCTION METHOD

(75) Inventor: Shigeru Moriya, Kanagawa (JP)

(73) Assignee: Sony Corporation, Tokyo (JP)

( * ) Notice: Subject to any disclaimer, the term of this patent is extended or adjusted under 35 U.S.C. 154(b) by 385 days.

(21) Appl. No.: 11/003,968

(22) Filed: Dec. 3, 2004

(65) Prior Publication Data
US 2005/0133734 A1 Jun. 23, 2005

(30) Foreign Application Priority Data
Dec. 18, 2003 (JP) .......................... P2003-420685

(51) Int. Cl.
*G21G 5/00* (2006.01)
(52) U.S. Cl. .............................. 250/492.2; 250/491.1; 250/492.22; 250/492.23; 250/492.3; 430/522.3; 430/30; 430/296
(58) Field of Classification Search ............... None
See application file for complete search history.

(56) References Cited

U.S. PATENT DOCUMENTS

| | | | | |
|---|---|---|---|---|
| 5,177,365 | A * | 1/1993 | Yamada .................. | 250/492.2 |
| 5,288,567 | A * | 2/1994 | Sakamoto et al. .......... | 430/5 |
| 6,040,096 | A * | 3/2000 | Kakizaki et al. ............ | 430/5 |
| 6,946,665 | B2 * | 9/2005 | Muraki et al. ........... | 250/492.1 |
| 6,955,993 | B2 | 10/2005 | Omori et al. | |
| 6,998,201 | B2 | 2/2006 | Koike | |
| 7,034,314 | B2 * | 4/2006 | Goto .................. | 250/396 ML |
| 7,098,991 | B2 * | 8/2006 | Nagasaka et al. ............ | 355/53 |
| 7,109,500 | B2 | 9/2006 | Omori et al. | |
| 2002/0084429 | A1 | 7/2002 | Craighead et al. | |
| 2003/0042434 | A1 | 3/2003 | Mankos et al. | |
| 2004/0155204 | A1 * | 8/2004 | Kumano et al. ......... | 250/492.1 |

FOREIGN PATENT DOCUMENTS

| | | |
|---|---|---|
| EP | 0 009 562 | 7/1979 |
| JP | 2951947 | 5/1999 |
| JP | 2003-59819 | 2/2003 |
| WO | 98/33197 | 7/1998 |

OTHER PUBLICATIONS

European Search Report dated Dec. 20, 2006.

* cited by examiner

Primary Examiner—Jack I. Berman
Assistant Examiner—Andrew Smyth
(74) Attorney, Agent, or Firm—Sonnenschein Nath & Rosenthal LLP

(57) ABSTRACT

An exposure method and a semiconductor device production method that control a rise in temperature of a mask irradiated by a charged particle beam. A displacement of the position of a pattern accompanying with the rise in temperature of the mask and the pattern are projected on an exposed object with a high accuracy. After an electron beam scans one scan line, scan lines are jumped by over a number of scan lines and the electron beam scans the next scan line. Since the number of the overjumped lines is a set number that control the temperature rise of a membrane by overlapping of the electron beam, the temperature rise is controlled by an interlaced-scanning. After one interlaced-scanning, similar to the above the scan lines are jumped over by the predetermined number of scan lines and the electron beam scans the next scan lines.

26 Claims, 15 Drawing Sheets

FIG. 1 – PRIOR ART

| | MEMBRANE MATERIAL | | SILICON | DIAMOND |
|---|---|---|---|---|
| MASK | HEAT PARAMETER | DENSITY(Kg/m3) | 2330 | 3513 |
| | | HEAT CAPACITY(J/Kg·K) | 712 | 500 |
| | | HEAT CONDUCTANCE(J/m·s·K) | 168 | 2000 |
| | MECHANICAL PARAMETER | YOUNG'S MODULUS(Pa) | 1.60E+11 | 1.00E+12 |
| | | COEFFICIENT OF LINEAR THERMAL EXPANSION(1/K) | 2.60E-06 | 1.32E-06 |
| | | POISSON'S RATIO | 0.2 | 0.2 |
| | STRUCTURE PARAMETER | THICKNESS(m) | 0.5E-6~1.0E-6 | |
| | | WIDTH(m) | 1.0E-3~2.3E-2 | |
| EXPOSURE APPARATUS | BEAM PARAMETER | BEAM DIAMETER (HALF MAXIMUM AT FULL WIDTH)(m) | 1.00E-03 | |
| | | BEAM CURRENT(A) | 5E-6~2E-5 | |
| | | ACCELERATION VOLTAGE(V) | 2000 | |
| | SCAN PARAMETER | SCAN LENGTH V(m) | 2.5E-2~6.6E-2 | |
| | | SCAN WIDTH H(m) | 2.5E-2~6.6E-2 | |
| | | INERVAL OF SCAN LINES P(m) | 1.0E-5~5.0E-5 | |
| | | NUMBER OF OVERJUMPED LINES | 0~2000 | |
| RESIST | | SENSITIVITY(C/m2) | 0.01~0.1 | |

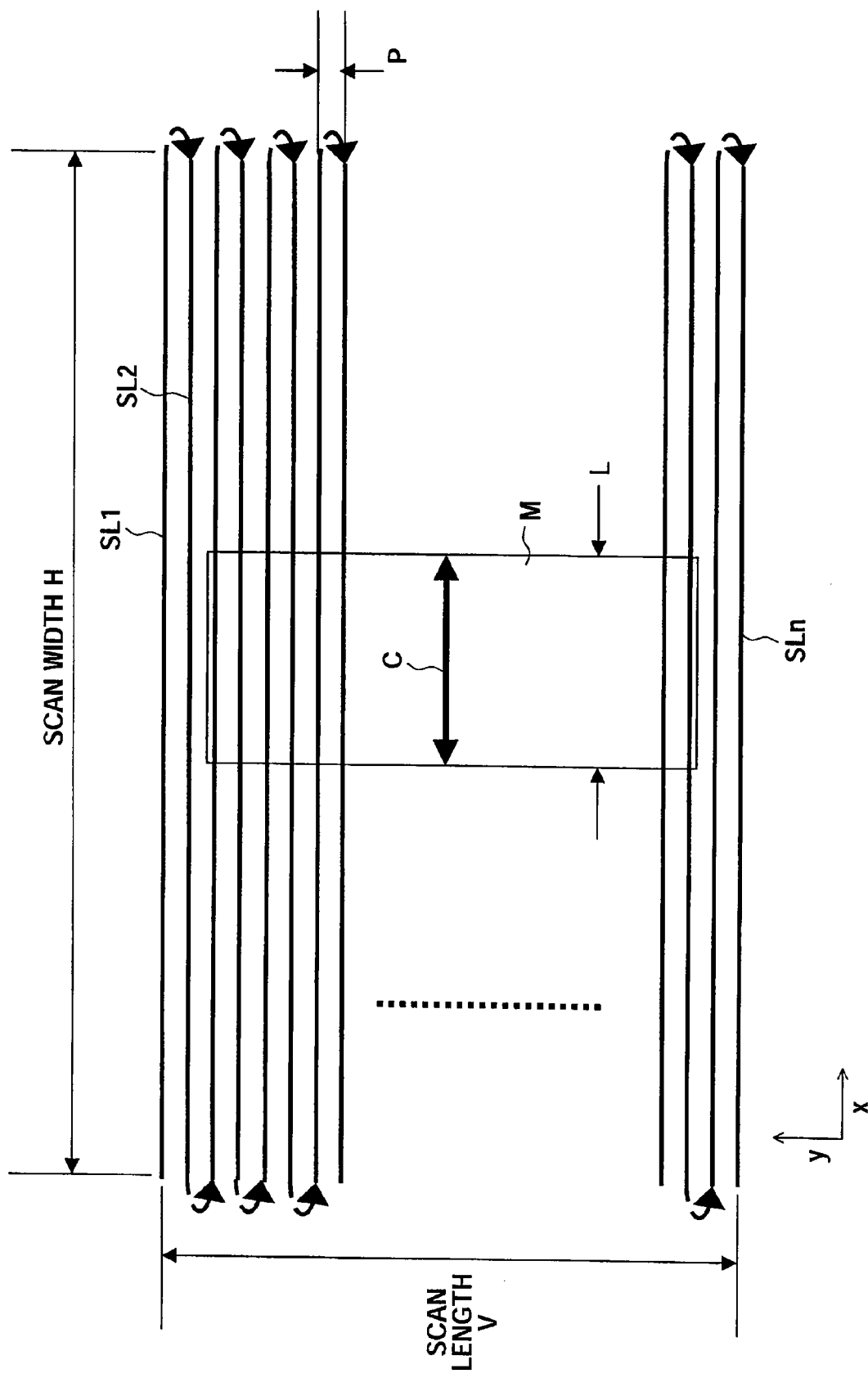
FIG. 2 – PRIOR ART

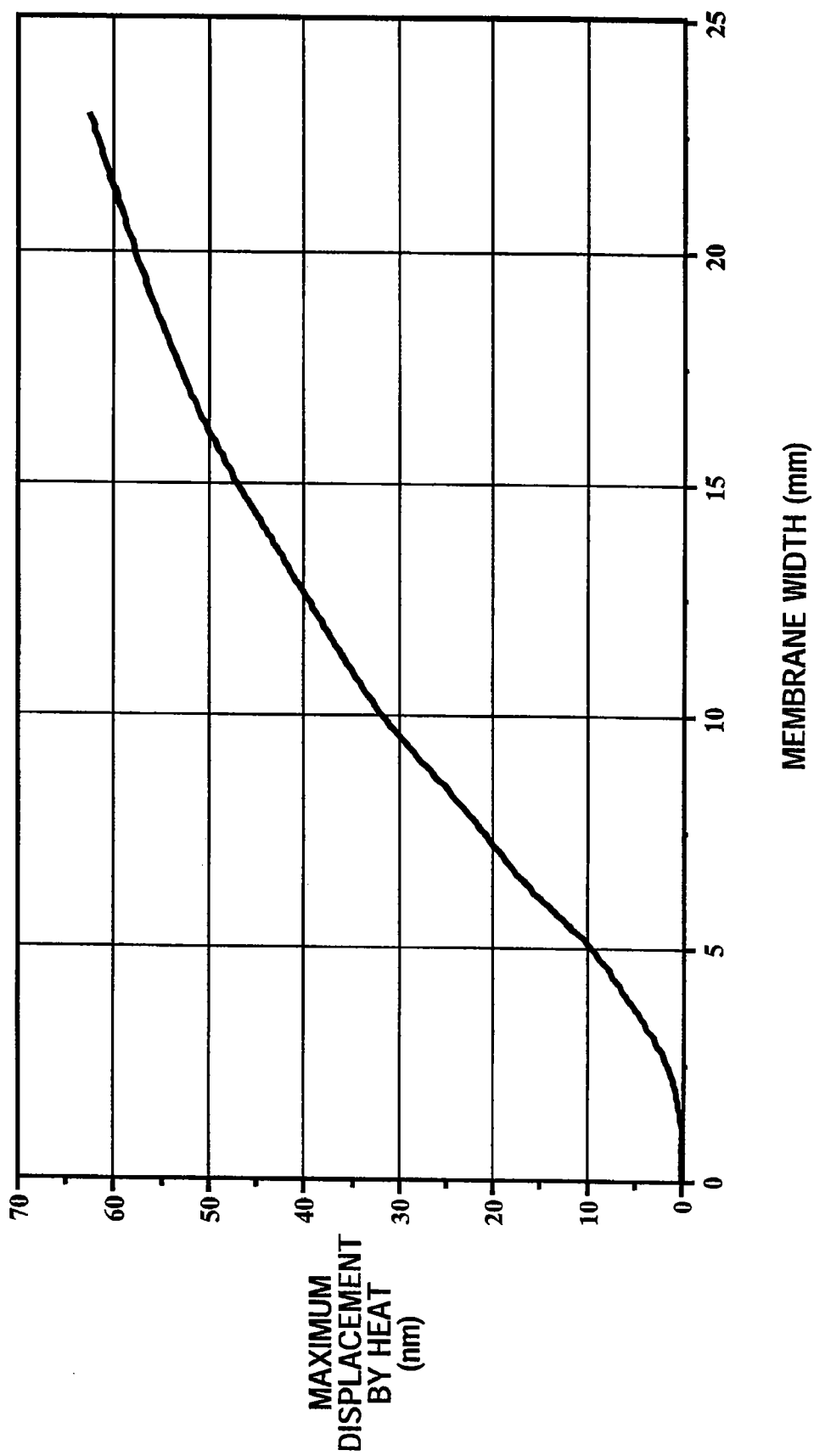
FIG. 3 - PRIOR ART

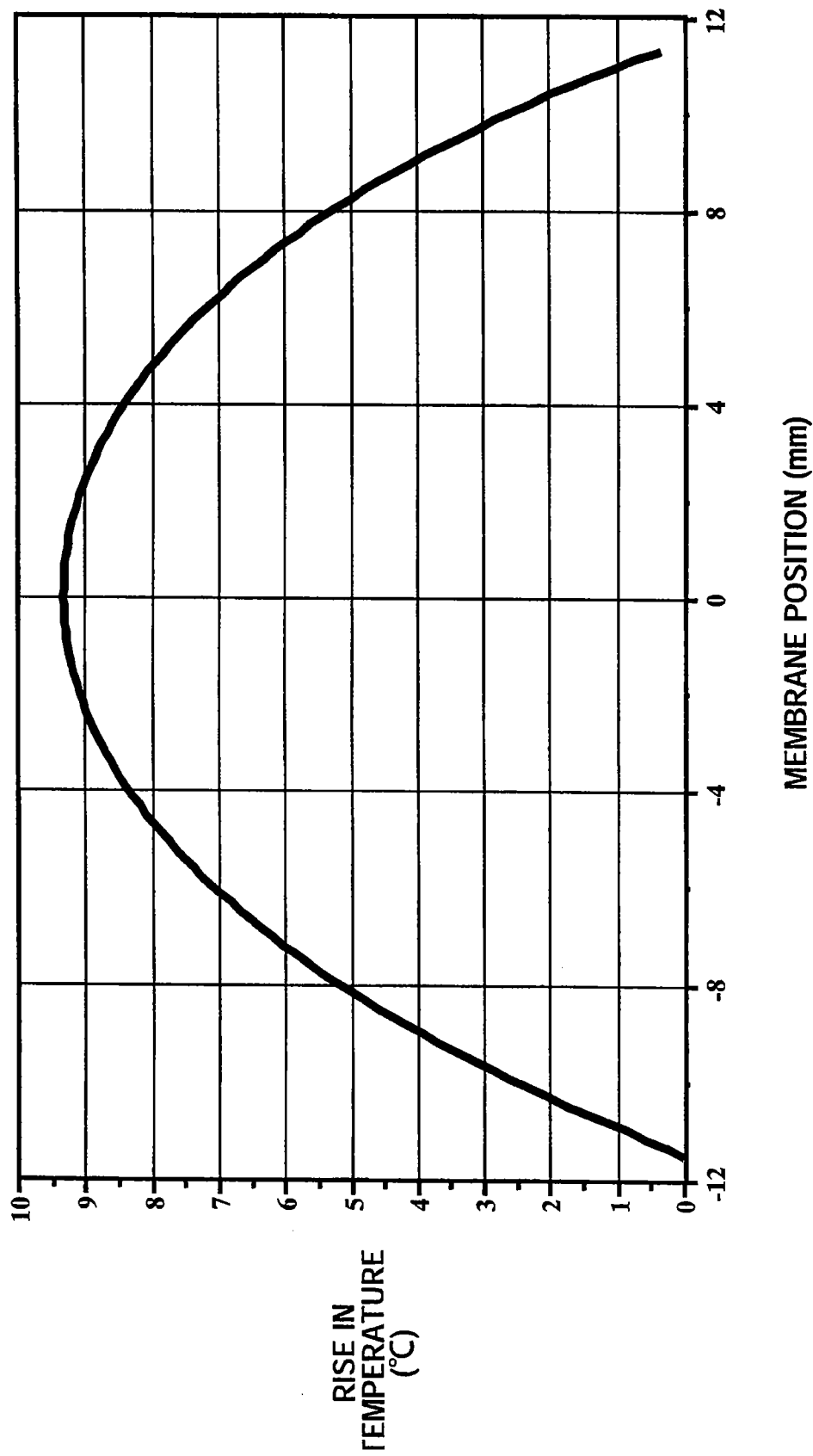
FIG. 4 – PRIOR ART

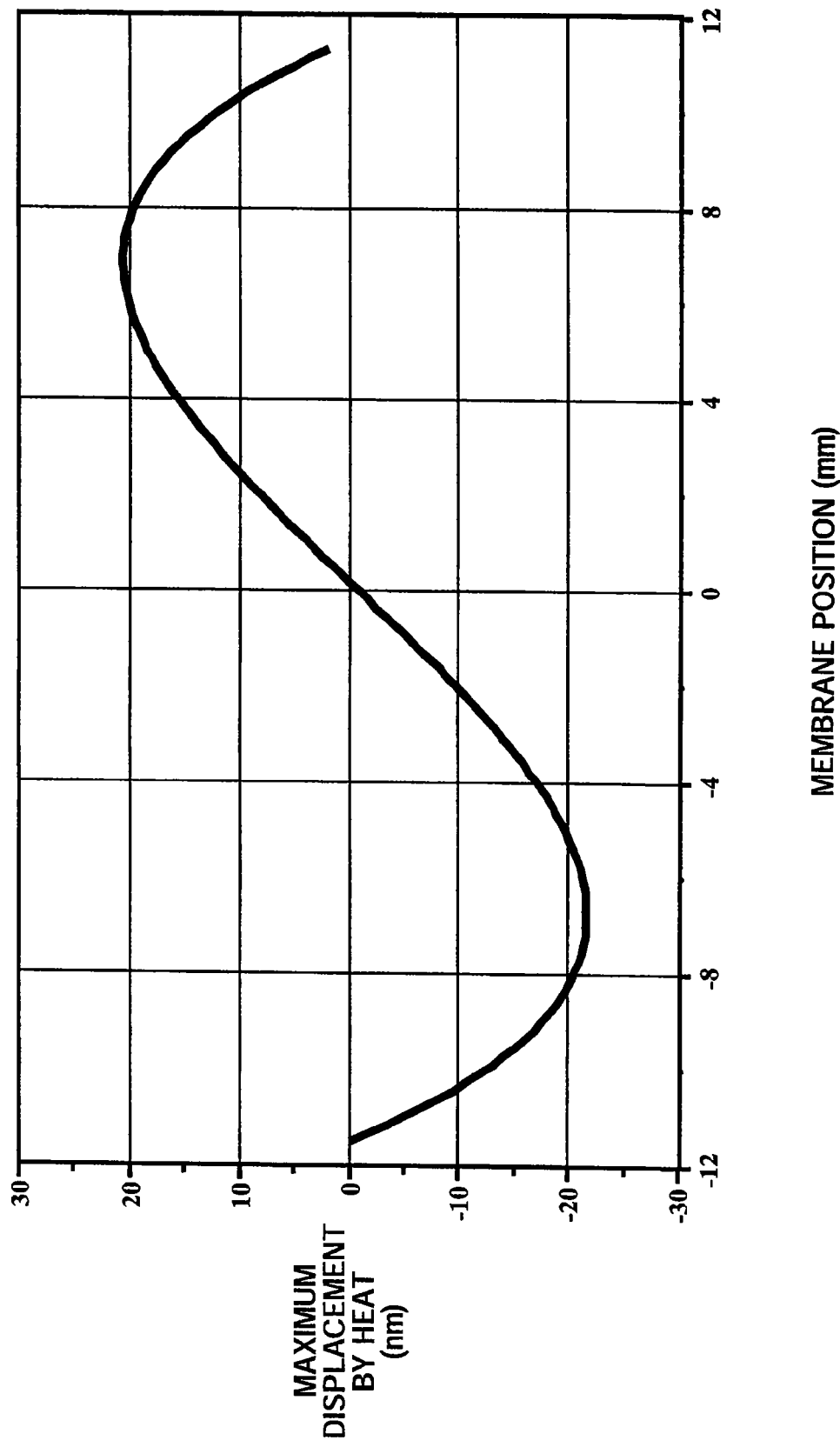
FIG. 5 – PRIOR ART

EXPOSURE APPARATUS, EXPOSURE METHOD AND SEMICONDUCTOR DEVICE PRODUCTION METHOD

BACKGROUND OF THE INVENTION

1. Field of the Invention

The present invention relates to, for example, an exposure apparatus that scans a mask by a charged particle beam to project a pattern, an exposure method, and a semiconductor device production method forming a circuit pattern of the semiconductor device by using the exposure method.

2. Description of the Related Art

A proximity exposure technology of equal scale that a mask called as a stencil mask that a mask pattern is formed by an aperture is located close to a wafer and a low acceleration electron beam is irradiated to the mask to perform an exposure is disclosed (refer to Japanese examined patent publication No. 2951947). For realizing this exposure technology, the development of a stencil mask with a thin film, which is called as membrane, having a thickness from about 500 nm to 1 µm and the development of resist process of 100 nm or less are performed now.

For keeping mechanical strength of the membrane that the aperture of the pattern is formed, it is necessary that size of one membrane is reduced and a mask structure that the membrane is sectioned small and reinforced by beams (strut) is suggested (refer to Japanese unexamined patent publication No. 2003-59819). In this case, since the aperture of the pattern cannot be formed at the position of the beam, a complementary division technology that desired circuit pattern is projected by dividing a circuit pattern that should be projected on the wafer, forming each divided pattern on a plurality of membranes, and overlapping the membranes to expose that is necessary.

In the above Japanese unexamined patent publication No. 2003-59819, size of one membrane is decided as about from 1 mm to 3 mm by sectioning by beams, then a mask that arrangement of the beams on four mask regions is displaced is disclosed. By overlapping four mask regions to expose them, a predetermined circuit pattern is projected on the wafer. In the mask described in the above Japanese unexamined patent publication No. 2003-59819, size of one mask region is about as large as size of a die (chip) that is a unit exposed region of the wafer.

Therefore, in the method described in the above Japanese unexamined patent publication No. 2003-59819, in the case that four mask regions formed on the stencil mask are scanned once, the scanning range of an electron beam is twice the die or more in both length and breadth. In the proximity exposure technology of equal scale disclosed in the Japanese examined patent publication No. 2951947, if the scanning range of the electron beam is large, it is difficult to keep electron beam parallel and to scan by the beam with a high accuracy.

As mentioned above, for improving mechanical strength of a mask, it is preferable that a membrane is sectioned small by a plurality of beams and size of one membrane is reduced about 1 mm to 3 mm. However, if the membrane is sectioned by a plurality of beams, since an aperture of the pattern cannot be formed at the position of the beams, for example like a mask structure described in the Japanese unexamined patent publication No. 2003-59819, there is a problem that four mask regions of the same size as the die is needed, and the scanning range of the electron beam becomes large.

Moreover, if the membrane is sectioned small by the beams, the problem that complementary division of the pattern becomes complicated arises.

Meanwhile, in recent years, there is a prospect that it is realized that size of membrane is about 2.0 mm (July 2003, the fourth LEEPL forum). If a stencil mask having one membrane without the beams is realized, the scanning range of the electron beam may be larger than size of the die to a certain degree, and the above problem seems to be solved.

However, if size of one membrane forming an aperture of the pattern becomes large, an important issue such as rise in temperature because of the following reason in exposing and generation of displacement of the pattern position over an acceptable value associated with this occurred.

A reason of rise in temperature is that electron beams made to scan on the membrane overlap. Note that the above Japanese examined patent publication No. 2951947 describes that rise in temperature does not occurs only because energy of the used electron beam is small. However, since rise in temperature is really decided by a product of energy of the electron beam and time of irradiating the electron beam, even if using a low energy electron beam if time of irradiating is long, temperature of the membrane rises. Since time of irradiating the electron beam is decided by exposed resist sensitivity, it is necessary to discuss presence or absence of rise in temperature of the membrane in consideration of the resist sensitivity.

As described later, even in the case that energy of the electron beam is small as 2 keV like actual LEEPL, if the membrane size is made to be large, rise in temperature to the degree that displacement of the pattern over an acceptable value occurs is confirmed.

The other reason of rise in temperature is that decay time of temperature risen once of the membrane is proportional to the square of size of the membrane (refer to "Rate processes", Hiroshi Komiyama work, Asakura bookstore, 1990). Therefore, if size of the membrane becomes too large, time required for temperature to restitute becomes longer. Consequently, the electron beams overlap and are irradiated on the membrane in a condition that temperature does not restitute, temperature of the membrane rises further, and displacement of position of the pattern formed on the membrane increases. Note that there is no description concerning decay of temperature in the above Japanese examined Patent Publication No. 2951947.

As mentioned above, in the case that size of the membrane is made to be large, an important issue such as rise in temperature of the membrane and displacement of the pattern position associated with that occurred. If the pattern position is displaced, error arises in the project pattern projected to the wafer arises and the pattern cannot be projected with a high accuracy.

SUMMARY OF THE INVENTION

The present invention is performed in consideration of the above circumstances, an object of the present invention is to produce an exposure apparatus and an exposure method that rise in temperature of the mask by irradiating a charged particle beam can be controlled, displacement of the pattern position associated with rise in temperature of the mask can be prevented and the pattern can be projected on an exposed object with a high accuracy.

The other object of the present invention is to produce a semiconductor device production method that rise in temperature of the mask by irradiating a charged particle beam can be controlled and displacement of the pattern position associated with rise in temperature of the mask can be prevented, the pattern can be projected on an exposed object with a high accuracy and a circuit pattern can be formed with a high accuracy.

To accomplish the above object, an exposure apparatus of the present invention has a mask having a pattern to be projected on an exposed object, a scan line set means setting a plurality of scan lines to be scanned by a charged particle beam on the mask, and a charged particle beam scan means that all the scan lines are scanned by the charged particle beam by performing interlaced-scanning by number of overjumped lines that can control rise in temperature of the mask due to overlapping of the charged particle beams, and for repeating the interlaced-scanning for the overjumped scan lines to scan all the scan line.

In the above exposure apparatus of the present invention, the interlaced-scanning of an electron beam is performed by a charged particle beam scan means. That is to say, after a charged particle beam scans on one scan line, the scan lines are jumped over by a predetermined number of overjumped lines and the charged particle beam scans on the next scan line. Since the number of overjumped lines is a set number that rise in temperature of the mask by overlapping of the charged particle beams can be controlled, rise in temperature of the mask can be controlled by the interlaced-scanning.

After a single interlaced-scanning is finished, in a similar way the scan lines are jumped over by predetermined number of overjumped lines for overjumped scan lines (un-irradiated scan lines) by a charged particle beam scan means and the charged particle beam scans en the scan lines.

By repeating the above interlaced-scanning, the charged particle beam scans en all set scan lines.

To accomplish the above object, the exposure method in the present invention has a step of setting a plurality of scan lines to be scanned by the charged particle beam on a mask that a pattern to be projected on an exposed object is formed and a step of performing the interlaced-scanning that the scan lines are jumped over by the number of overjumped lines that can control rise in temperature of the mask by overlapping the charged particle beam and the charged particle beam scans, and all the scan lines are scanned by the charged particle beam by repeating the interlaced-scanning for the overjumped scan lines.

In the above exposure method, the interlaced-scanning of the electron beam is performed for the mask. That is to say, after one scan line is scanned by the charged particle beam, the scan lines are jumped over by the predetermined number of scan lines and the next scan line is scanned by the charged particle beam. Since the number of scan lines is a set as number that can control rise in temperature of the mask by the overlapping of the charged particle beam, all the scan lines are scanned by the charged particle beam.

After a single interlaced-scanning is finished, in a similar way the scan lines are jumped over by the predetermined number of overjumped lines for overjumped scan lines by a charged particle beam scan means and the charged particle beam scans en the scan lines.

By repeating the above interlaced-scanning, the charged particle beam scans all set scan lines.

To accomplish the above object, the semiconductor device production method of the present invention is a semiconductor device production method that a pattern is projected to a resist formed on a substrate and by using the resist after projected the pattern the substrate is processed to form a circuit pattern of the semiconductor device, has a step of setting a plurality of scan lines that should be scanned by the charged particle beams on a mask that the pattern projected to the resist is formed, and has a step of performing the interlaced-scanning that the scan lines are jumped over by number of overjumped lines that can control rise in temperature of the mask by overlapping of the charged particle beam to be scanned by the charged particle beam, and by repeating the interlaced-scanning for the overjumped scan lines all the scan lines are scanned by the charged particle beam.

In the above semiconductor device production method of the present invention, in projecting the pattern to the resist, the interlaced-scanning of the electron beam is performed for the mask for projecting the pattern to the resist. That is to say, after one scan line is scanned by the charged particle beam, the scan lines are jumped over by predetermined number of overjumped lines and next scan line is scanned by the charged particle beam. Since number of overjumped lines is a set as number that can control rise in temperature of the mask by overlapping of the charged particle beam, rise in temperature of the mask is controlled.

After a single interlaced-scanning is finished, for the overjumped scan lines in a similar way the scan lines are jumped over by predetermined number of overjumped lines and the scan lines are scanned by the charged particle beam.

By repeating the above interlaced-scanning, all the scan lines are scanned by the charged particle beam. Herewith, all patterns formed on the mask are projected to the resist. By processing the substrate by using the resist after the pattern projected, a circuit pattern of the semiconductor device is formed.

According to the exposure apparatus and the exposure method of the present invention, rise in temperature of the mask by irradiating a charged particle beam can be prevented, displacement of the pattern position associated with rise in temperature of the mask can be prevented and the pattern can be projected on an exposed object with a high accuracy.

According to the semiconductor device production method of the present invention, rise in temperature of the mask by irradiating a charged particle beam can be controlled and displacement of the pattern position associated with rise in temperature of the mask can be prevented, the pattern can be projected to the exposed object with a high accuracy and the circuit pattern can be formed with a high accuracy.

BRIEF DESCRIPTION OF THE DRAWINGS

These and other objects and features of the present invention will become clearer from the following description of the preferred embodiments given with reference to the accompanying drawings, in which:

FIG. 1 is a view showing an example of a property value of an exposure apparatus concerning the present embodiment, a mask used in the exposure apparatus and a resist exposed by the mask;

FIG. 2 is a view for explaining a conventional method of an electron beam scanning;

FIG. 3 is a view showing displacement of a pattern of a membrane in the case of using silicon for a membrane material in a conventional method of an electron beam scanning;

FIG. 4 is a view showing a result of an analysis of a membrane position and rise in temperature in the case of using diamond for a membrane material in a conventional method of an electron beam scanning;

FIG. 5 is a view showing a result of an analysis of a membrane position and maximum displacement of a pattern by the heat in a conventional method of an electron beam scanning;

DESCRIPTION OF THE PREFERRED EMBODIMENTS

Figure 6:
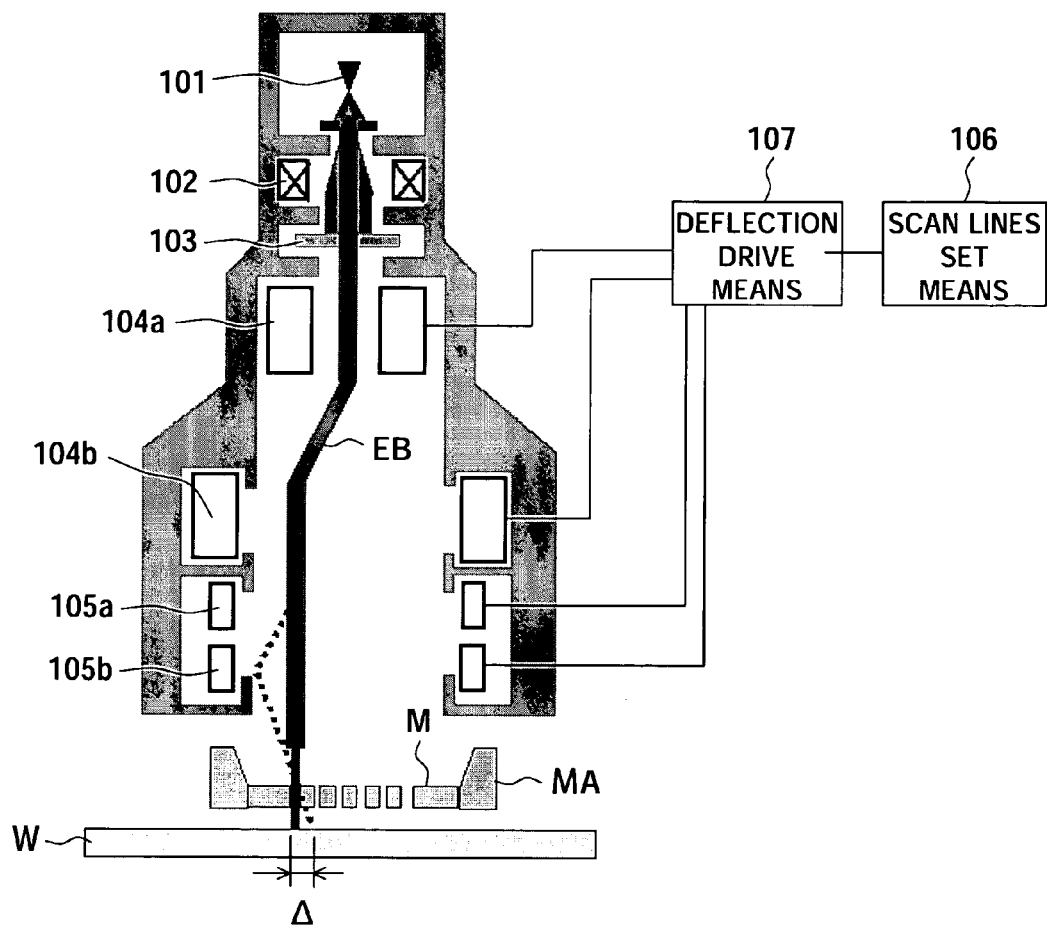
FIG. 6 is a schematic construction view of an exposure apparatus concerning the present embodiment.

Preferred embodiments of the present invention will be described with reference to the accompanying drawings.

FIG. 1 shows an example of a property value of an exposure apparatus concerning the present embodiment, a mask used in the exposure apparatus and a resist exposed by the mask.

As shown in FIG. 1, for considering heat displacement of a pattern by thermal expansion of the mask, it is necessary to clarify heat parameters, such as density, heat capacity and heat conductance, mechanical parameters, such as Young's modulus, coefficient of linear thermal expansion and Poisson's ratio, and structure parameters, such as thickness and width. Consequently, as an example, the above parameters of silicon and diamond that are leading materials for the membrane now are shown in FIG. 1. The material is not limited in the present invention, further preferable material can be used, however the case of adopting silicon and diamond is explained for an example in the present embodiment.

In FIG. 1, as properties of an exposure apparatus, beam parameters (half maximum at full width), beam current and acceleration voltage and scan parameters, such as scan length V, scan width H, interval of scan lines P and overjumped lines are shown.

(Examination of Rise in Temperature of the Membrane and Displacement of the Pattern Position in a Conventional Method of an Electron Beam Scanning)

First, by using property values of an exposure apparatus, a mask and a resist shown in FIG. 1, examination of rise in temperature of the membrane and displacement of the pattern position in a conventional method of an electron beam scanning was performed.

FIG. 2 is a view for explaining a conventional method of an electron beam scanning.

As shown in FIG. 2, in the case that a membrane M of a mask exists, for exposing a mask pattern consisting of apertures formed in the membrane, first, a plurality of scan lines SL1 to SLn stretching in an x direction and lining in certain intervals in a y direction in the view are set. The length of horizontal scanning in the x direction is defined as scan width H that corresponds to the length of the scan line, and the length of a vertical scan length in the y direction is defined as scan length V in the view.

For simplification of explanation, the interval of scan lines P is widened and illustrated, however, the interval of scan lines P is, for example, actually about 10 μm as shown in FIG. 1. Since the beam diameter (half maximum at full width) is about 1 mm (refer to FIG. 1), the beam diameter is about 100 times the interval of the scan lines and greatly wider. The interval of the scan lines is very narrow for the beam diameter as mentioned above to resolve a variation of the beam and to improve the position accuracy of the pattern projected to on the resist by scanning finely with an electron beam. Moreover, as mentioned later, in an exposure by an electron beam, by changing irradiating angle of the electron beam by deflection, the pattern position projected to the resist can be corrected. Since a pattern formed in the membrane M is, for example, 50 nm to 60 nm, there is an advantage that the position correction of the pattern formed on the membrane M can be performed more finely when the interval of scan lines are made small.

In a conventional electron beam exposure, after an electron beam scans from left to right on the top scan line SL1, the electron beam is moved lower to the next scan line SL2, further the electron beam scans from right to left on the scan line SL2. As mentioned above, the electron beam scans on the scan lines set in descending order and scans by turns to the bottom scan line SLn. The scanning speed is determined by the resist sensitivity. In the case that the electron beam scans as mentioned above, if the beam diameter is defined as 1 mm and the interval of scan lines P is defined as 10 μm, 100 electron beams are overlapped at one membrane position.

FIG. 3 is a view showing a result analyzing the position in the x direction in the middle portion of the membrane C and a maximum displacement of the pattern by rise in temperature in the case of changing the membrane width L in the x direction of the membrane M as shown in FIG. 2 to irradiate the electron beam to the resist by a conventional method of an electron beam scanning.

In the analysis, silicon is used as a membrane material and membrane thickness is defined as 500 nm, beam diameter (half maximum at full width) is defined as 1 mm, beam current is defined as 5 μA, scan width (H) is defined as 25 mm, scan length (V) is defined as 25 mm, interval of scan lines (P) is defined as 10 μm and the resist sensitivity is defined as 1.6 μC/cm².

As shown in FIG. 3, in the case of using the membrane having size of about 1 mm to 3 mm disclosed in Japanese Unexamined Patent Publication No. 2003-59819, there is no problem because the maximum displacement of the pattern by the heat is 1 nm or less. However, if the membrane size of 5 mm, the maximum displacement is about 10 nm, and if the membrane size is set to 23 mm equal to the tip size, the maximum displacement of the pattern becomes 60 nm or more.

For projecting the pattern of size of about 50 nm to 60 nm formed in the membrane M, that displacement of the pattern should be is reduced to be 1 nm or less. Therefore, in the case of using silicon for the membrane, it is apparent that a mask having the membrane size of 3 mm or more cannot be used in the conventional method of an electron beam scanning.

Since the rise in temperature of the membrane by an electron beam scanning on a scan line is about 0.2 degrees C. to 0.4 degrees C., that is to say 1 degrees C. or less, there is no effect on displacement of the pattern. However, in the conventional method of an electron beam scanning, since the electron beam scans on the scan line in descending order, almost 100 electron beams will overlap one after another. Even if the membrane size is small as 3 mm or less, the rise in temperature is small because the heat is transmitted to the surrounding thick film portion (beam portion) quickly. However, if the membrane size becomes large, since a decay time of temperature of the membrane is proportional to the square of the membrane size, the electron beam overlaps and scans before the temperature has fallen. Therefore, the temperature of the membrane rises and, as a result, an undesirable pattern displacement occurs.

FIG. 4 is a view showing the analysis result of the membrane position and the rise in temperature in the case that the membrane material is diamond, and FIG. 5 is a view showing the analysis result of the membrane position and the maximum displacement of the pattern by the heat.

FIG. 4 is the analysis result in the case that the thickness of the membrane consisting of diamond is decided as 700 nm, the membrane width L is decided as 23 nm equal to the die size, that is to say a mask consisting of the one membrane having no beam, and the other condition is equal to the condition in FIG. 3.

Diamond is regarded as the ideal material at the present time as a material having very large heat conductance and high mechanical rigidity. The heat conductance of diamond is 10 or more times higher than silicon as shown in FIG. 1.

However, as shown in FIG. 4, especially in the middle portion of the membrane, the temperature rises 9 degrees C. In the edge portion of the membrane that contacts with the thick film portion, since the temperature is transmitted quickly, the temperature hardly rises. That is to say, that temperature is rising like a quadratic function from the edge part to the middle part, because the heat is hard to be radiated, since the middle portion is distant from the thick film portion.

As shown in FIG. 5, even in the case of using diamond for the membrane material, in the mask consisting of one membrane equal to the die size, the pattern position is displaced up to ±20 nm as a result of the rise in temperature of the membrane showing in FIG. 4. As shown in FIG. 5, the displacement of the pattern is 0 in the edge of the membrane fixed by the thick film portion, and the displacement of the pattern is 0 in the middle portion since the patterns is expanded from side to side in the x direction. Therefore, the displacement of the pattern becomes the maximum at the center of the middle portion and the edge portion. That is to say, the middle portion and the edge portion become the fixed edges, the membrane is expanded greatly.

As mentioned above, as examined about the rise in temperature of the membrane and the displacement of the pattern position in the conventional method of an electron beam scanning, in the case of scanning a mask consisting of one membrane having no beam by the conventional method of beam scanning, that undesirable displacement of the position occurs. Note that the membrane width is decided as 23 mm in FIG. 4 and FIG. 5, however, this membrane width belongs to a small category as die width reduced-projected by an optical mask.

The Present Embodiment

Hereinafter, a method of interlaced-scanning concerning the present embodiment for solving the above problem will be explained. First, an exposure apparatus for realizing the interlaced-scanning concerning the present embodiment will be explained. FIG. 6 is a schematic block diagram of the exposure apparatus concerning the present embodiment. The exposure apparatus shown in FIG. 6 is an exposure apparatus applied to LEEPL technology.

The exposure apparatus shown in FIG. 6 has an electron gun 101, a condenser lens 102, an aperture 103, a pair of main deflector 104a and 104b, a pair of sub deflector 105a and 105b, a scan line set means 106 and a deflection drive means 107.

The electron gun 101 shoot an electron beam EB with an acceleration voltage of about 2 kV. The electron beam shot from the electron gun 101 converges to a parallel beam through the condenser lens 102. The unwanted portion of the electron beam EB converged to the parallel beam is shadowed by the aperture 103.

After the electron beam EB is swung to the target in which the electron beam EB is irradiated by the main deflector 104a, the electron beam EB is swung back to the direction parallel to the optical axis by the main deflector 104b. Hereby, the electron beam EB is irradiated almost vertically to the mask MA. Further, by the main deflector 104a and 104b, the electron beam EB scans on the target scan line SL.

The sub deflector 105a and 105b control an incident angle of the electron beam EB to the mask MA to correct the pattern position projected on a wafer W. By inclining the electron beam EB slightly, the pattern of the mask MA displacing from the accurate position is corrected to the accurate position on the wafer W and is projected. As shown in FIG. 6, by controlling an irradiating angle, the irradiating position of the electron beam EB to the wafer W is moved by Δ.

By the electron beam EB passed through an aperture pattern formed on the membrane M of the mask MA in FIG. 6, a resist on the wafer W that is not illustrated in a view is exposed. In the exposure apparatus shown in FIG. 6, the exposure of an equal scale is adopted, and the mask MA having the membrane M in which the pattern is formed and the wafer W are arranged close to each other.

The scan line set means 106 sets a plurality of scan lines that should be scanned by the electron beam on the mask MA. The deflection drive means 107 controls the main deflector 104a, 104b and the sub deflector 105a, 105b. The deflection drive means 107, the main deflector 104a, 104b and the sub deflector 105a, 105b correspond to a means of an electron beam scanning of the present invention.

In the present embodiment, the interlaced-scanning that the electron beam EB scans to jump over scan lines set by the scan line set means 106 by the number of overjumped lines that can control the rise in temperature of the mask MA, for details membrane M, by overlapping of the electron beam EB is performed. Further, by repeating the interlaced-scanning for the interlaced-scan lines, the electron beam EB scans on all set scan lines.

An Example of Interlaced-Scanning

Figure 7:
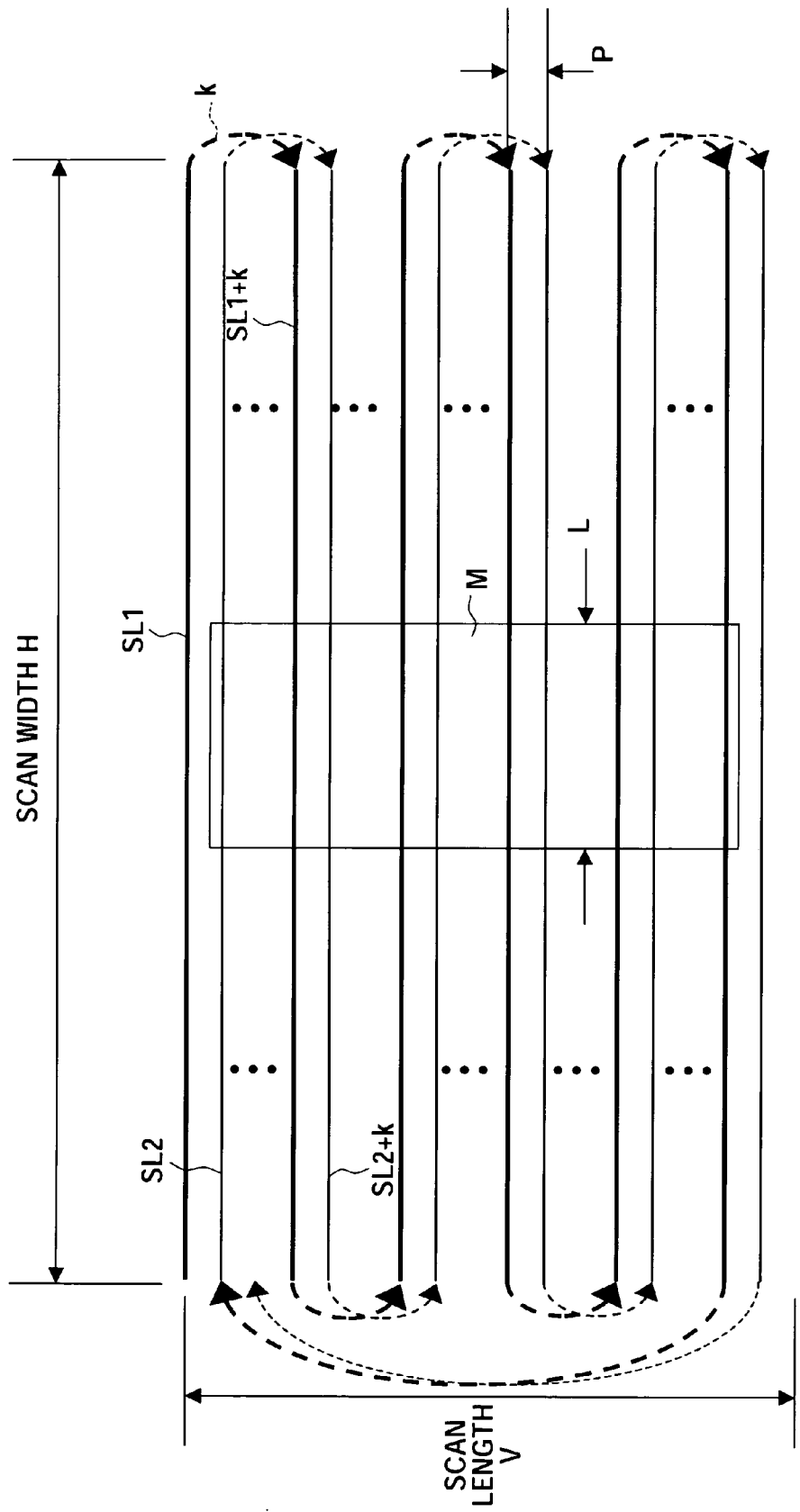
FIG. 7 is a view for explaining an example of an interlaced-scanning in an exposure method concerning the present embodiment.

FIG. 7 is a view for explaining an example of the interlaced-scanning performed in the exposure apparatus and the exposure method concerning to the present embodiment.

In FIG. 7, for clear explanation, the number of the scan lines is thinned out than shown in FIG. 2, the number of the scan lines SL and the interval of the set scan lines are set in a conventional manner. Moreover, in the case that the position of scan line is not made issue of especially, it is called simply as the scan line SL. For example, several thousand scan lines SL, for example about 4000, are set on the membrane M of the mask MA. However, setting number of scan lines SL may be changed as 2000 or 1000 of membrane size according to size of the membrane M.

In the present embodiment, after the electron beam scans from left to right on the top scan line SL1 in the view, the scan lines SL are jumped over by k (number of overjumped lines), the electron beam is moved down to the scan line SL1+k and further the scan line SL1+k is scanned from right to left by the electron beam. As mentioned above, the electron beam is made to jump over by k from top to bottom in the fixed direction, to scan en the scan line and to scan to the bottom scan line SL by turning direction at the end of each scan. The scanning speed is determined by the resist sensitivity.

After the single interlaced-scanning to the bottom scan line SL is finished, the interlaced-scanning is repeated for the interlaced-scan lines SL. For example, the electron beam is swung back to the second scan line SL2 from the top. Further, as similar to the above, after the electron beam scans from left to right on the scan line SL2, the scan lines SL are jumped over by k, the electron beam is moved down to the scan line SL2+k and further the scan line SL2+k is scanned from right to left by the electron beam.

By repeating the above interlaced-scanning, all the set scan lines SL are scanned by the electron beam. In the case that number of overjumped lines is defined as k, by repeating the interlaced-scanning k times all the scan lines SL are scanned.

Figure 8:
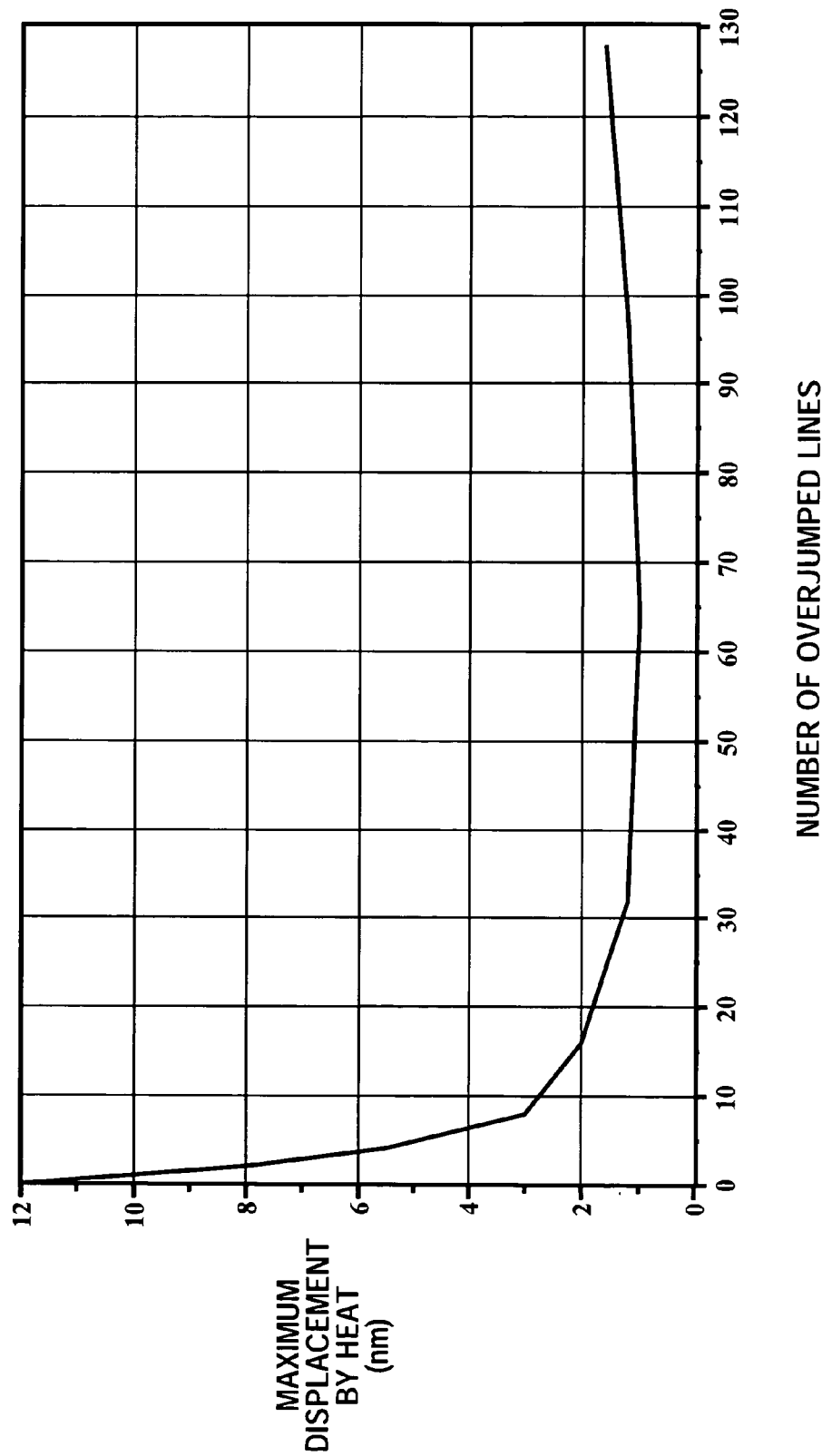
FIG. 8 is a view showing a result of analyzing number of overjumped lines and maximum displacement of a pattern by the heat in the case of irradiating an electron beam to a resist by an interlaced-scanning.

FIG. 8 is a view showing the result of analyzing the number of overjumped lines and the maximum displacement of the pattern by the heat in the case of irradiating the electron beam to the mask by the electron beam interlaced-scanning as shown in FIG. 6.

In the analysis, silicon is used for the membrane material, the membrane thickness is defined as 500 nm, the membrane width L is defined as 6 mm, the beam diameter (half maximum at full width) is defined as 1 mm, the beam current is defined as 20 µA, the scan width H is defined as 50 mm, the scan length V is defined as 50 mm, the interval of scan lines P is defined as 12.5 µm and the resist sensitivity is defined as 1 µC/cm$^2$. FIG. 8 is a view showing the relationship between the number of overjumped lines and the displacement of the position of the middle portion of the membrane M in FIG. 7 in the case that the electron beam is made to interlaced-scan to the membrane M in the above condition. The scan width H and the scan length V are defined larger than the case of FIG. 3 to FIG. 5 by assuming the application of the mask consisting of the membrane with the beams.

As shown in FIG. 8, the displacement of the pattern by the heat is reduced sharply with the increase in the number of overjumped lines, when the number of overjumped lines is 50 to 70, the displacement of the pattern becomes the minimum, afterward the displacement of the pattern by the heat increases gently. A sharp reduction of in the displacement of the pattern by the increase of in the number of overjumped lines is due to the reduction of overlapping of the beams. In the case that the number of overjumped lines is defined as 70 or more, the displacement of the pattern increases by the heat, because the next interlaced-scanning starts before the temperature of the membrane has fallen, since the time required for single interlaced-scanning is reduced by increase of number of overjumped lines.

As shown in FIG. 8, the optimized value is reached for a certain number of overjumped lines. If it can be optimized, then the displacement of the pattern by the heat can be reduced within an acceptable value even in the large membrane width that is difficult by the conventional method of an electron beam scanning.

Rise in temperature is closely related to the resist sensitivity. It is because if the resist sensitivity is low, the rise in temperature becomes more remarkable, since if the resist sensitivity is low, it is necessary to lengthen irradiation time of the electron beam (to slow down the scanning speed of the electron beam) so much. Therefore, in the case that the resist sensitivity is low, in the interlaced-scanning shown in FIG. 7, after the scanning speed is sped up more than, for example, the necessary scanning speed to perform the interlaced-scanning for all the scan lines SL, the interlaced-scanning may be performed repeatedly for all the scan lines SL.

Figure 9:
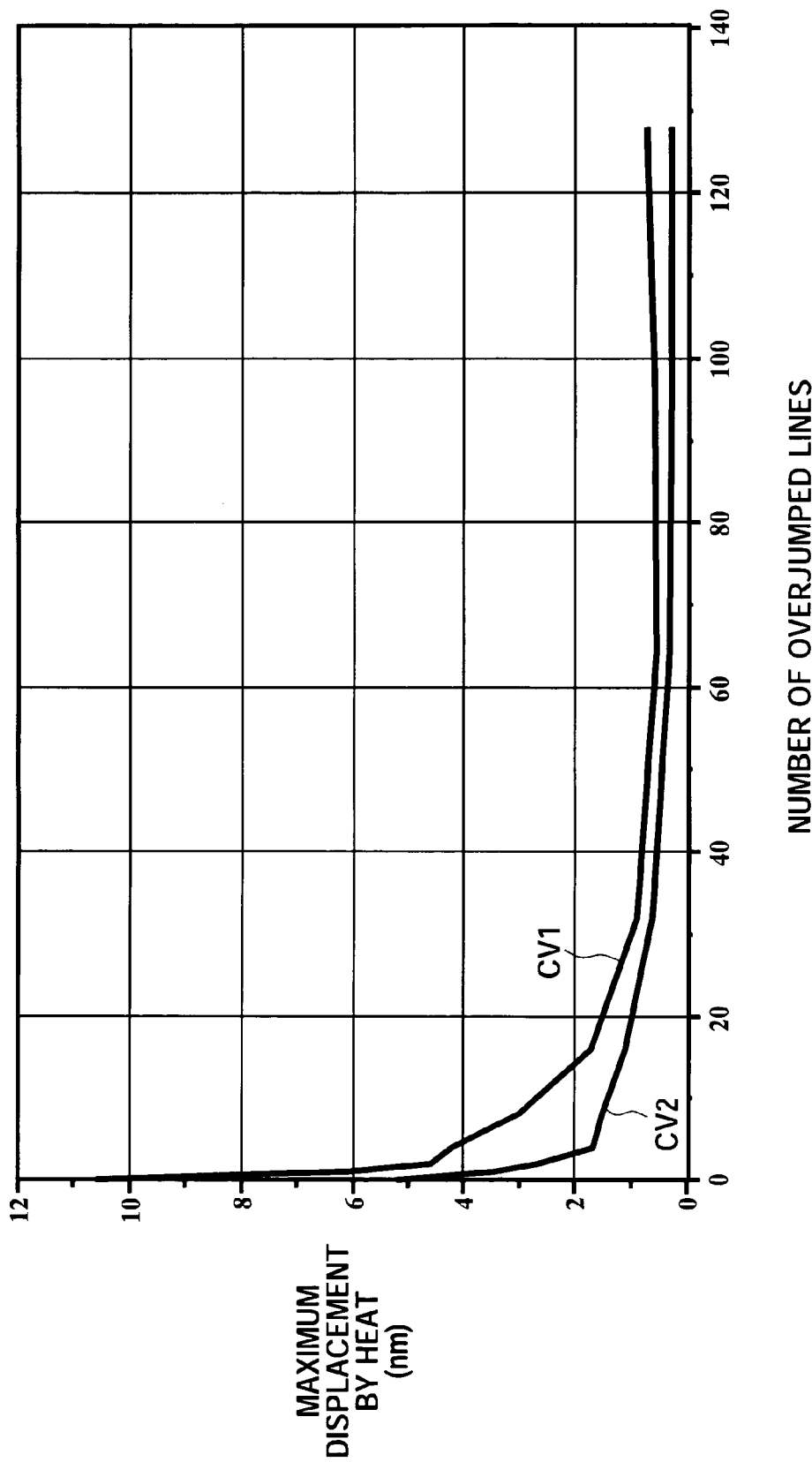
FIG. 9 is a view showing a result of analyzing number of overjumped lines and maximum displacement of a pattern by the heat in the case of adopting diamond for a membrane material.

FIG. 9 is a view of a relationship between the number of scan lines and the maximum displacement of the pattern by the heat in the case that diamond is adopted for the membrane material. Moreover, the other conditions are equivalent to the analysis in the case of silicon shown in FIG. 8. In FIG. 9, the case where the membrane width L is defined as 13 mm (shown as CV1 in the view) and the case that where the membrane width is defined as 9 mm (shown as CV2 in the view) are shown.

As shown in FIG. 9, by combining the interlaced-scanning and the diamond having high heat conductance and high rigidity, even if the membrane width is 13 mm, maximum displacement of the pattern by the heat is reduced to 1 nm or less.

The Other Example of Interlaced-Scanning

In the interlaced-scanning shown in FIG. 7, an example that the interlaced-scanning of the electron beam from top to bottom in the fixed direction is performed repeatedly was explained. However, in this method, a stabilization time that the electron beam is stabilized id if needed after the electron beam is swung back to the top, since it is necessary that the electron beam is swung back from bottom to top again after the single interlaced-scanning to the bottom scan line SL and the big load is applied to the main deflector 104 and 104b. If the stabilization time is lengthened, a throughput of exposure will be affected. In the present example, an example of the interlaced-scanning that stabilization time can be shortened will be explained.

Figure 10:
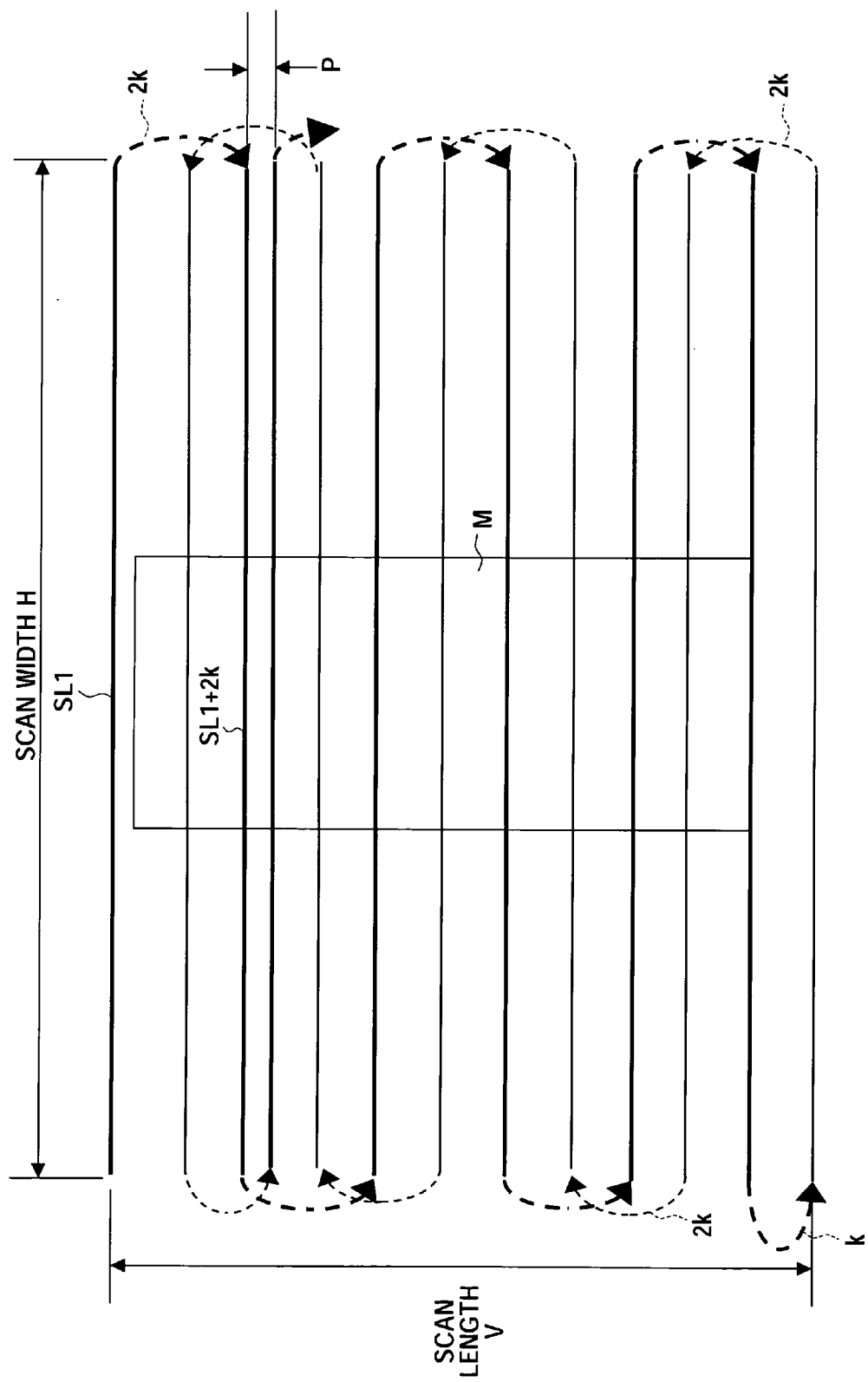
FIG. 10 is a view for explaining the other example of an interlaced-scanning.

FIG. 10 is a view for explaining the other example of the interlaced-scanning. In FIG. 7 an example that the interlaced-scanning is performed by an optimal number of overjumped lines k, however in the present example after the interlaced-scanning of the electron beam in the fixed direction by twice optimal number of overjumped lines k, the interlaced-scanning of the electron beam in opposite of the fixed direction is performed repeatedly.

That is to say, as shown in FIG. 10, after the electron beam scans from left to right on the top scan line SL1, the scan lines SL are jumped over by 2 k, the electron beam is moved down to the scan line SL1+2 k and further the scan line SL1+2 k is scanned from right to left by the electron beam. As mentioned above, the electron beam is made to jump over by 2 k from top to bottom in the fixed direction, to scan on the scan line and to scan to the bottom scan line SL by turns. The scanning speed is determined by the resist sensitivity.

After the single interlaced-scanning to the bottom scan line SL is finished, the electron beam is moved by the optimal number of overjumped lines k up or down (FIG. 10 shows an example of making to move down) the interlaced-scanning that 2 k scan lines SL are jumped over is performed from bottom to top in opposite to the above. Herewith the scan lines SL between the scan lines SL scanned in the previous interlaced-scanning are scanned.

After interlaced-scanning from bottom to top is finished, in a similar way, by repeating interlaced-scanning from top to bottom and interlaced-scanning from bottom to top, the electron beam scans on all set scan lines SL.

In the above interlaced-scanning, after the interlaced-scanning from top to bottom in the fixed direction is finished, there is almost no time required for decay in temperature in the membrane position of the bottom portion or the top portion since the interlaced-scanning begins from bottom to top in the opposite direction. However, since the interlaced-scanning is performed by twice the optimal number of overjumped lines, in the membrane position of the bottom portion or the top portion the result similar to performing the interlaced-scanning by optimal number of overjumped lines is obtained, hence the control effect of the rise in temperature equal to the method of scanning shown in FIG. 7 can be obtained. Further, since the electron beam may not be swung back largely, the stabilization time can be shortened.

Since the displacement of the pattern by the heat can be controlled by using the exposure method adopting the interlaced-scanning concerning the present embodiment, the membrane of large size can be adopted. However, as shown in FIG. 9, even in the case of adopting diamond that has ideal heat conductance and mechanical rigidity at the present time as the membrane material, in order to control displacement of the pattern by 1 nm or less, it is necessary that the membrane width is about 13 mm or less (refer to CV1 in FIG. 9). Therefore, it is difficult to expose a die of size of about 26 mm.times.33 mm by the mask consisting of a sheet of membrane.

Therefore, hereinafter, an example of the mask that the membrane as large size as possible is adopted and displacement of pattern by the heat can be controlled by adopting the exposure method concerning the present embodiment.

A First Example of Preferred Mask

Figure 11:
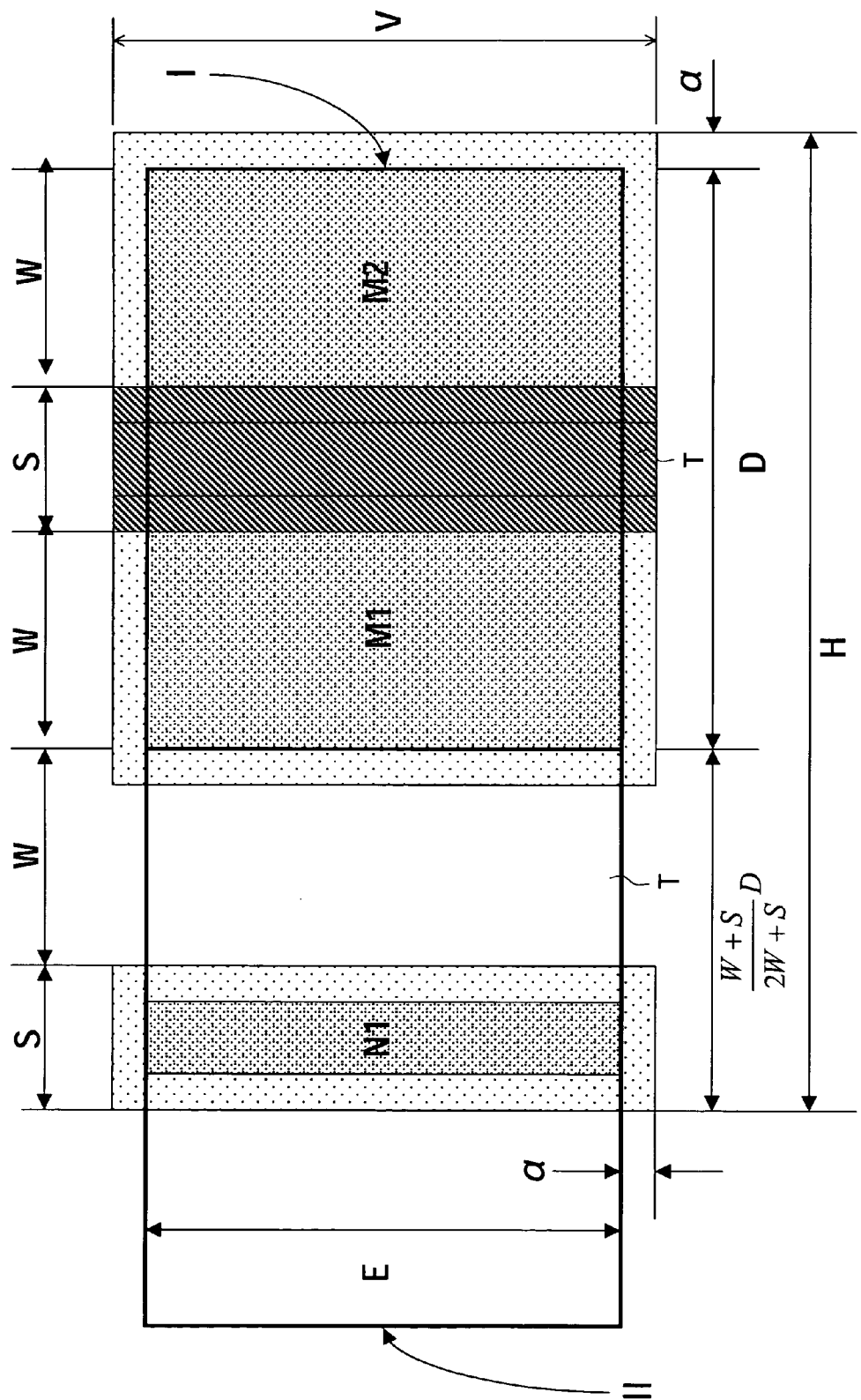
FIG. 11 is a view showing a first example of a mask used for the present embodiment preferably.

FIG. 11 is a view showing a first example of a preferred mask.

As shown in FIG. 11, a horizontal size of dies I, II that are a target of exposure is defined as D, a vertical size is defined as E. As mentioned above, since it is difficult that the mask consisting of a sheet of the mask of equal size to the dies I, II is used, a beam of thick film T sections to two main membrane M1, M2 and a portion corresponding to the beam T is defined as a sub membrane N1 to prepare for a mask.

Figure 12:
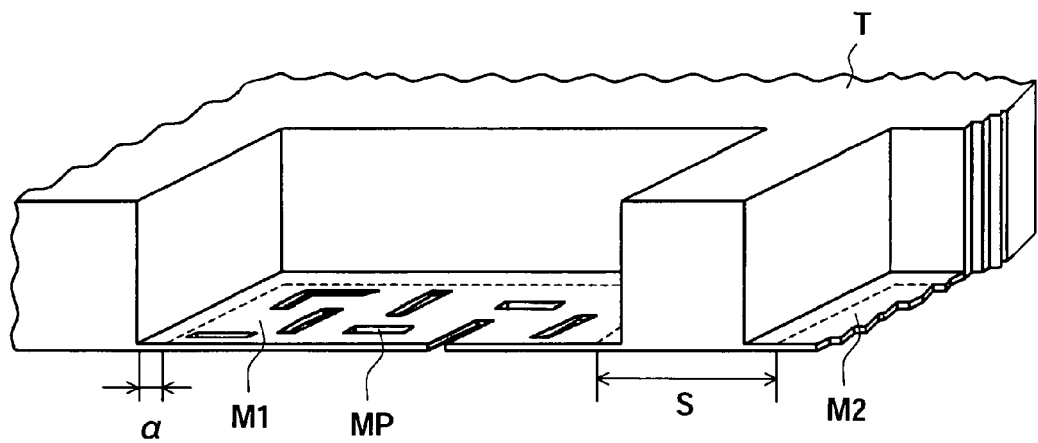
FIG. 12 is a perspective view of principal portion of a mask of FIG. 11.

When the width of the main membrane M1, M2 is defined as W and the width of the beam T is defined as S respectively, the width of the sub membrane N1 becomes S. However, the width of the main membrane M1, M2 is actually extended by a margin 'α'. FIG. 12 is a perspective view of a principal portion of the main membrane M. As shown in FIG. 12, in the main membrane M1 a margin a is set between the main membrane M1 and the beam T, on the main membrane M1 a pattern MP composed of the aperture is formed. Between the main membrane M1 and the main membrane M2 the beam T is formed. The width S of the beam T shown in FIG. 11 contains the margin α.

In the exposure using a mask shown in FIG. 11, the electron beam is made to interlaced-scan in the region including the main membrane M1, M2 and the sub membrane N1. Herewith, the pattern of the main membrane M1, M2 is projected on the die I, the pattern of the sub membrane N1 is projected on the die II. Afterward, by moving the projected wafer by the horizontal size D of the die and performing projecting, the region of the beam T that cannot be projected by the main membrane M1, M2 is projected by the sub membrane N1.

From the relationship shown in FIG. 11, the following equation is obtained.

$$W \geq (D-S)/2 \text{ however } S > 2\alpha$$

$$H = \frac{W+S}{2W+S}D + D + \alpha = \{1.5 + S/(4W+2S)\}D + \alpha$$

In the above equation, H is the scan width. When the horizontal size D=26 mm and the vertical size E=33 mm are assumed as the maximum die size at the present time, if diamond is adopted as the membrane and the membrane width (W+2α) is defined as 13 mm, even if S=1 mm, the margin α=0.25 mm can be assured and the scan width may be 1.53 times the horizontal size of the die D. Since a scanning considering the beam diameter is needed, the actual scan width is added about 2 mm at the both side and becomes about 1.72 times the horizontal size of the die D.

The mask of the above construction has large size membranes M1, M2, M3, however, by using the exposure devise and the exposure method concerning the present embodiment displacement of the pattern by the heat can be reduced. Moreover, since the scan width H is about 1.72 times the horizontal size of the die, the scan width H can be reduced.

A Second Example of Preferred Mask

Figure 13:
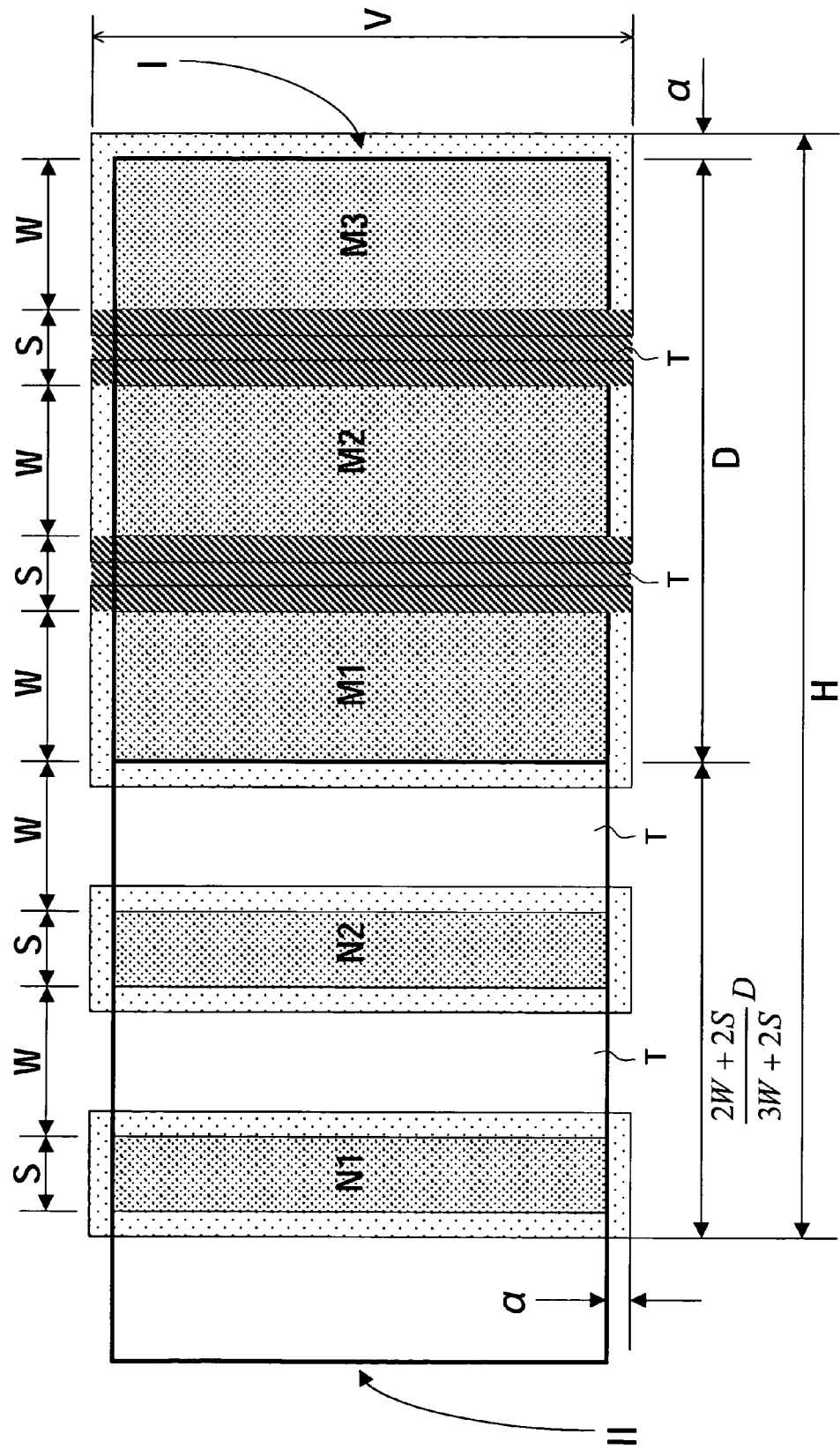
FIG. 13 is a view showing a second example of a mask used for the present embodiment preferably.

FIG. 13 is a view showing a second example of a preferred mask. In the above first example, the mask consisting of the minimum number (three) of the membranes that displacement of the pattern by the heat can be reduced to 1 nm or less was explained, however, by making the mask construction consisting of five membranes, silicon can be used as the membrane material.

As shown in FIG. 13, in the mask concerning the present embodiment three main membranes M1, M2, M3 are sectioned by two beams of the thick film T, and the portion corresponding to two beams T (containing the margin α) are defined as the sub membranes N1, N2 to prepare for the mask.

When the widths of the main membranes M1, M2, M3 are decided as W respectively, the width of the beam T is decided as S, the width of the sub membrane N1 becomes S. However, actually, the point that the widths of the main membrane M1, M2, M3 are expanded a as a margin and the width S of the beam T includes the margin α is similar to the above.

As mentioned above, by the arrangement of the sub membranes N1, N2 that is only one smaller than number of the main membranes for two or more main membranes M1, M2, M3, the magnification of the scan width H for the horizontal size of the die D becomes high, however the membrane composed of a silicon material of the membrane width of 6 mm that displacement of the pattern is confirmed to be controlled 1 nm or less by the interlaced-scanning can be adopted (refer to FIG. 8).

In the exposure using the mask shown in FIG. 11, the electron beam is made to interlaced-scan the region including the main membranes M1, M2, M3 and the sub membranes N1, N2. Herewith, in the die I the patterns of the main membranes M1, M2, M3 are projected, and in the die II the patterns of the sub membranes N1, N2 are exposed. Afterward by moving the projected wafer by the horizontal width of the die D to project, the region of the beam T that cannot be projected by the main membranes M1, M2, M3 is projected by the sub membranes N1 N2.

Moreover, in the example shown in FIG. 11 the main membranes M1, M2 show two masks and the sub membrane N1 shows one mask, and the example shown in FIG. 13 the main membranes M1, M2, M3 show three masks and the sub membranes N1, N2 show two masks, however, in a similar way number of the main membranes and the sub membranes can be increased. Moreover, in the case of using the mask shown in FIG. 13, the scan width H is calculated to replace (W+S)/(2W+S) in the above equation by (2W+2S)/(3W+2S). As understood to see the above equation, in the case of setting the beams, the scan width H is reduced to about 1.5 times the horizontal size D in the case that number of the membranes is decided as the minimum, and if number of the membranes increases, the scan width H becomes less than twice the horizontal size of the die D even if number of membranes increases.

A Third Example of Preferred Mask

Figure 14:
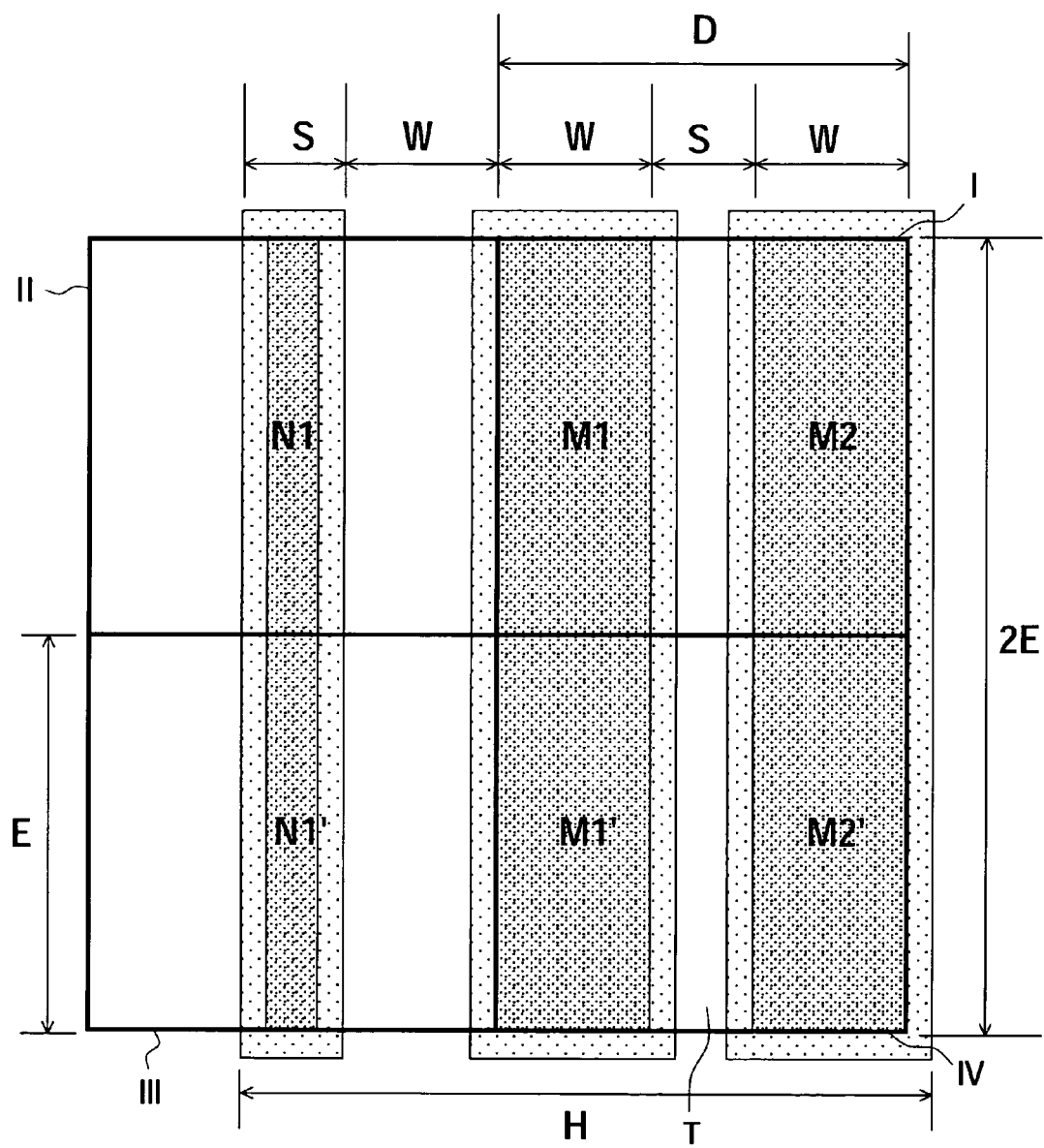
FIG. 14 is a view showing a third example of a mask used for the present embodiment preferably.

FIG. 14 is a view showing a third example of a preferred mask.

The mask shown in FIG. 14 is a mask that the vertical length of the main membranes M1, M2 and the sub membrane N1 shown in FIG. 11 are expanded to the adjacent die III, IV, further the main membranes M1', M2' and the sub membrane N1' are formed. The main membrane M1 and the main membrane M1', the main membrane M2 and the main membrane M2', the sub membrane N1 and the sub membrane N1' are not sectioned by the beams, they are respectively composed of one membrane.

In the exposure using the mask shown in FIG. 14, the electron beam is made to interlaced-scan the region including the main membranes M1, M2, M1', M2' and the sub membranes N1, N2. Next, for example in the case of focusing on the die I, after the patterns of the main membranes M1, M2 are exposed, the wafer is moved by the horizontal size of the die D to expose the pattern of the sub membrane N1, further the wafer is moved by the vertical size of the die E to expose the sub membrane N1', and further the wafer is moved by the horizontal size of the die D to expose the patterns of the main membranes M1, M2. Herewith for one die, overlapping the main membranes M1, M2 and the sub membrane N1, the membranes M1', M2' and the sub membrane N1' are exposed. That is to say, the mask can perform a complementary exposure.

In the mask shown in FIG. 14, the vertical size of each membrane is about twice the membrane shown in FIG. 11, however, the horizontal size does not change. Since displacement of the pattern by the heat is affected by the square of the shorter size among the horizontal size and the vertical size of the membrane, there is no problem if the membrane is lengthen vertically like this. It is the same about the mechanical strength.

The mask of the above constitution has the membrane of comparatively large size, however, by using for the exposure apparatus and the exposure method concerning the present embodiment, the mask has the effects that the complementary exposure can be performed, besides displacement of the pattern by the heat can be prevented.

A Fourth Example of Preferred Mask

Figure 15:
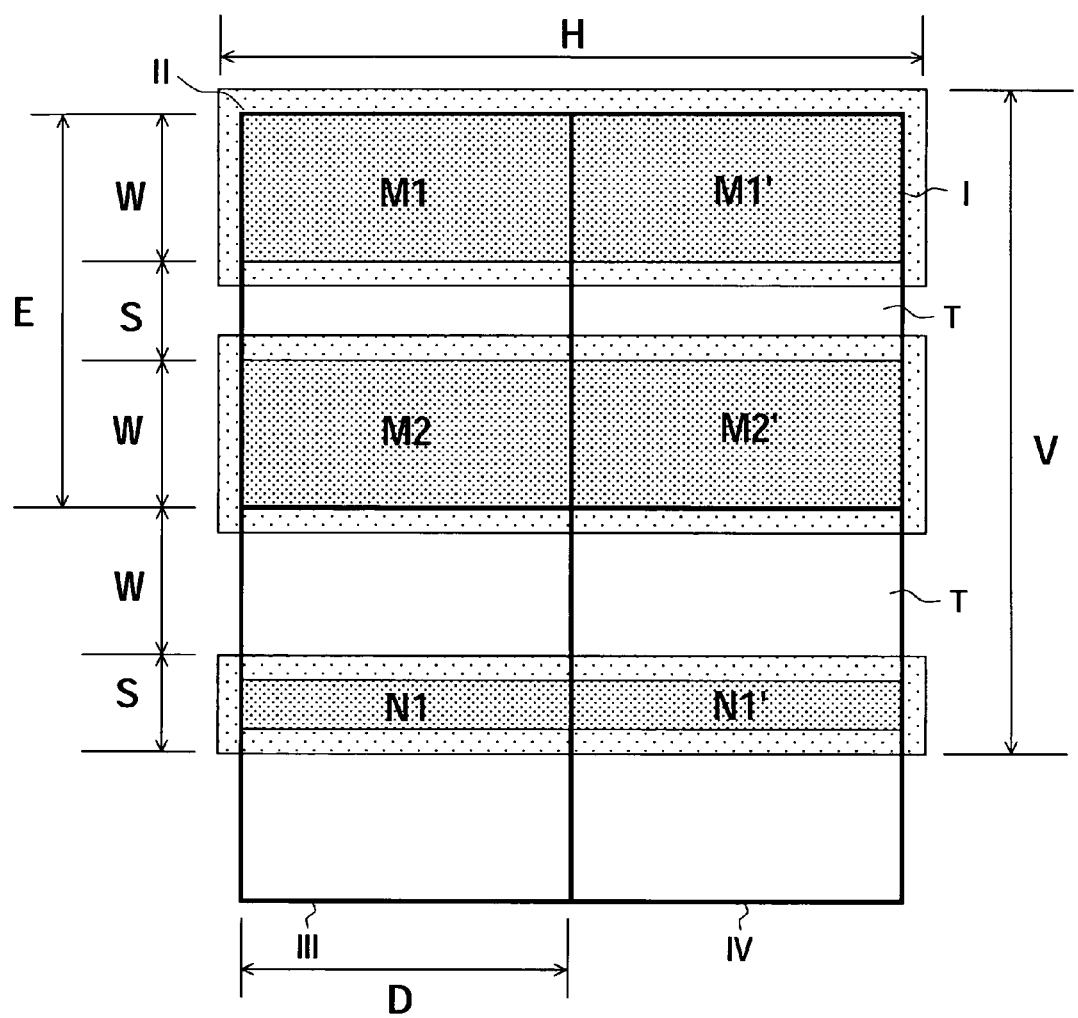
FIG. 15 is a view showing a fourth example of a mask used for the present embodiment preferably.

FIG. 15 is a view showing a fourth example of a preferred mask.

In the mask shown in FIG. 15, the horizontal size and the vertical size of the membrane are opposite to FIG. 14, for four dies I, II, III, IV, the mask is an example of a mask that the complementary exposure can be performed by a horizontally long membrane. In the mask of the present example, the vertical size E of the dies I to IV that is an object of the exposure is divided into the vertical size W of two main membranes M1, M2 and the size S of the beam T sectioning the main membranes. Moreover, the portion corresponding to the beam T is decided as the sub membrane N1 to prepare for the mask. The horizontal size of each membrane M1, M2, N1 is expanded, further the main membranes M1', M2', the sub membrane N1' are formed.

The main membrane M1 and the main membrane M1', the main membrane M2 and the main membrane M2', the sub membrane N1 and the sub membrane N1' are not sectioned by the beam, they are constituted by one membrane respectively.

In the exposure using the mask shown in FIG. 15, the electron beam is made to interlaced-scanned the region including the main membranes M1, M2, M1', M2' or the sub membranes N1, N1'. Moreover, as similar to FIG. 14, for one die, by overlapping the main membranes M1, M2 and the sub membrane N1, the main membranes M1', M2' and the sub membrane N1' are exposed. That is to say, it is the mask that the complementary exposure can be performed.

The scan width of the mask shown in FIG. 15 is calculated by replacing the horizontal size D of the above equation (1) by the vertical size E. In the case of adopting diamond as the membrane material, when the vertical size that is shorter size of the membrane is decided as 13 mm, in the similar way the mask that displacement of the pattern by the heat is small can be realized.

The mask of the above constitution has the membrane of comparatively large size, however, by using for the exposure apparatus and the exposure method concerning the present embodiment, the mask has the effects that the complementary exposure can be performed, besides displacement of the pattern by the heat can be controlled.

The exposure apparatus and the exposure method concerning the present embodiment explained in the above have the effects explained below. As mentioned above, by adopting the interlaced-scanning, since rise in temperature of the membrane can be controlled, displacement of the pattern formed in the membrane can be reduced the acceptable value or less without sacrificing throughput. Hence, the position accuracy of the projected pattern projected on the exposed object can be improved by using the mask that the pattern is formed in the membrane.

Moreover, since displacement of the pattern by the heat can be controlled, the membrane of large size can be adopted and the mask with the beam of simple constitution can be used. Note that for the exposure apparatus and the exposure method concerning the present embodiment the conventional mask as described in Japanese Unexamined Patent Publication No. 2003-59819 can be used.

The exposure apparatus and the exposure method concerning the present embodiment are applied preferably to the production of the semiconductor devices that the position accuracy of the pattern required is especially high. In the production of the semiconductor device, after forming a processed layer, by applying a resist on the processed layer, exposing and developing to form the resist pattern, and processing the processed layer by using the resist pattern as an etching mask, the circuit pattern is formed. By repeating the above process, a semiconductor integrated circuit is formed. By applying the exposure apparatus and the exposure method concerning the present embodiment to the production process of the semiconductor device, the circuit pattern with a high accuracy can be formed.

The present invention is not limited to the above explanation of the embodiments. In the present embodiment, an example of the electron beam is explained, however, except for the electron beam, a charged particle beam such as an ion beam and so on can be applied in a similar way. Moreover, in the present embodiment, an example that the mask that the pattern is formed by the aperture on the membrane is also explained, however a mask that the pattern of a scatterer is formed on the membrane can be used if the membrane is adopted, in a similar way, the displacement of the pattern by the heat occurs easily.

Note that the present invention is not limited to the above embodiments and includes modification within the scope of the claims.

What is claimed is:

1. An exposure apparatus comprising:
   a mask having a pattern to be projected on an exposed object;
   a scan line set means for setting a plurality of scan lines to be scanned by a charged particle beam on said mask, and;
   a charged particle beam scan means for performing interlaced-scanning by number of overjumped lines being possible to control rise in temperature of said mask due to overlapping of said charged particle beam, and for repeating said interlaced-scanning for said overjumped lines to scan all said scan lines.

2. An exposure apparatus as set forth in claim 1, wherein said charged particle beam scan means performs said interlaced-scanning by said number of overjumped lines being possible to minimize rise in temperature of said mask by reducing overlapping of said charged particle beam, and by assuring time required for once interlaced-scanning of said mask.

3. An exposure apparatus as set forth in claim 1, wherein said scan line set means sets a plurality of said scan lines arranged at an interval larger than a size of said pattern formed on said mask, and;
   said charged particle beam scan means scans with said charged particle beam having beam diameter larger than said interval of said scan lines.

4. An exposure apparatus as set forth in claim 1, wherein said charged particle beam scan means performs repeatedly interlaced-scanning of said charged particle beam in a fixed direction.

5. An exposure apparatus as set forth in claim 1, wherein said charged particle beam scan means performs interlaced-scanning of said charged particle beam repeatedly in a fixed direction and in a direction opposite to said fixed direction.

6. An exposure apparatus as set forth in claim 5, wherein said charged particle beam scan means performs interlaced-scanning repeatedly in said fixed direction and in said opposite direction to said fixed direction by the number of overjumped lines about twice the number being possible to minimize rise in temperature.

7. An exposure apparatus as set forth in claim 1, wherein said mask is a stencil mask having said pattern formed by an aperture on a thin film.

8. An exposure apparatus as set forth in claim 7, wherein said mask further comprises a beam portion reinforcing strength of said thin film and sectioning said thin film.

9. An exposure apparatus as set forth in claim 7, wherein said scan line set means sets a plurality of scan lines having length of 1.5 times or more and less than double size of a unit exposed region of said exposed object.

10. An exposure apparatus as set forth in claim 1, wherein said mask is an equal scale mask that is arranged close to said exposed object and formed with a pattern to be projected to said exposed object by an equal scale.

11. An exposure method comprising:
    a step of setting a plurality of scan lines to be scanned by a charged particle beam on a mask formed with a pattern to be projected to an exposed object;
    a step of performing interlaced-scanning by number of overjumped lines being possible to control rise in temperature of said mask due to overlapping of said charged particle beam, and;
    a step of repeating said interlaced-scanning for overjumped lines to scan all said scan lines by said charged particle beam.

12. An exposure method as set forth in claim 11, wherein said interlaced-scanning is performed by said number of overjumped lines being possible to be minimum rise in temperature of said mask by reducing overlapping of said charged particle beam and by assuring time required for single interlaced-scanning of said mask in the step of performing said interlaced-scanning.

13. An exposure method as set forth in claim 11, wherein a plurality of said scan lines are set to be arranged at an interval larger than size of said pattern formed on said mask in the step of setting said scan line, and;
    said interlaced-scanning is performed by charged particle beam having beam diameter larger than said interval of said scan line in the step of performing said interlaced-scanning.

14. An exposure method as set forth in claim 11, wherein interlaced-scanning of said charged particle beam in a fixed direction is performed repeatedly in the step of repeating said interlaced-scanning.

15. An exposure method as set forth in claim 11, wherein in the step of repeating said interlaced-scanning, interlaced-scanning of said charged particle beam is performed repeatedly in a fixed direction and in a direction opposite to said fixed direction.

16. An exposure method as set forth in claim 15, wherein interlaced-scanning is performed repeatedly in said fixed direction and in said opposite direction to said fixed direction by number of overjumped lines about twice the number being possible to minimize rise in temperature.

17. An exposure method as set forth in claim 11, wherein a stencil mask formed with an aperture pattern on a thin film is used as said mask.

18. An exposure method as set forth in claim 17, wherein said stencil mask is formed with a beam portion reinforcing strength of said thin film and sectioning said thin film.

19. An exposure method as set forth in claim 11, wherein a plurality of scan lines having length of 1.5 times or more and less than double size of a unit exposed region of said exposed object is set in the step of setting said scan lines.

20. An exposure method as set forth in claim 11, wherein said mask is formed with said pattern to be projected to said exposed object by an equal scale.

21. A semiconductor device production method, forming a circuit pattern of a semiconductor device, by projecting a pattern on a resist formed on a substrate and by using said resist after projecting a pattern to process said substrate, a semiconductor device production method comprising:

a step of setting a plurality of scan lines to be scanned by a charged particle beam on a mask formed with a pattern to be projected to an exposed object;

a step of performing interlaced-scanning by number of overjumped lines being possible to control rise in temperature of said mask due to overlapping of said charged particle beam, and;

a step of repeating said interlaced-scanning for said overjumped lines to scan all said scan lines by said charged particle beam.

22. A semiconductor device production method as set forth in claim 21, wherein said interlaced-scanning is performed by said number of overjumped lines being possible to minimize rise in temperature of said mask by reducing overlapping of said charged particle beam, and by assuring time required for once interlaced-scanning of said mask in the step of performing said interlaced-scanning.

23. A semiconductor device production method as set forth in claim 21, wherein a plurality of said scan lines arranged at an interval larger than a size of said pattern formed on said mask are set in a step of setting said scan lines, and;

said charged particle beam having beam diameter larger than said interval of said scan lines are used in a step of performing said interlaced-scanning.

24. A semiconductor device production method as set forth in claim 21, wherein interlaced-scanning of said charged particle beam is performed repeatedly in a fixed direction in a step of repeating said interlaced-scanning.

25. A semiconductor device production method as set forth in claim 21, wherein interlaced-scanning of said charged particle beam is performed repeatedly in a fixed direction and in a direction opposite to said fixed direction in a step of repeating said interlaced-scanning.

26. A semiconductor device production method of a as set forth in claim 25, wherein interlaced-scanning is performed repeatedly in said fixed direction and in said opposite direction to said fixed direction by the number of overjumped lines about twice the number being possible to minimize rise in temperature in a step of repeating interlaced-scanning in said fixed direction and in said opposite direction to said fixed direction.

* * * * *